United States Patent [19]

Dixon et al.

[11] Patent Number: 4,884,276

[45] Date of Patent: Nov. 28, 1989

[54] OPTICAL FEEDBACK CONTROL IN THE FREQUENCY CONVERSION OF LASER DIODE RADIATION

[75] Inventors: George J. Dixon, Lutz, Fla.; Douglas W. Anthon; John H. Clark, both of Wheaton, Ill.

[73] Assignee: Amoco Corporation, Chicago, Ill.

[21] Appl. No.: 260,255

[22] Filed: Oct. 20, 1988

Related U.S. Application Data

[63] Continuation-in-part of Ser. No. 125,161, Nov. 25, 1987, which is a continuation-in-part of Ser. No. 78,373, Jul. 27, 1987.

[51] Int. Cl.$^4$ ............................................. H01S 3/10
[52] U.S. Cl. ..................................... 372/21; 307/425; 372/75
[58] Field of Search ...................... 307/424, 425, 427; 372/4, 5, 20-23, 75, 92

[56] References Cited

U.S. PATENT DOCUMENTS

| | | | |
|---|---|---|---|
| 3,646,358 | 2/1972 | Firester | 307/425 |
| 3,983,406 | 9/1976 | Lax et al. | 307/425 |
| 3,984,675 | 10/1976 | Corcoran et al. | 307/425 |
| 4,656,635 | 4/1987 | Baer et al. | 372/27 |
| 4,717,842 | 1/1988 | Komine | 307/426 |
| 4,791,631 | 12/1988 | Baumert et al. | 372/22 |

OTHER PUBLICATIONS

Ammam; "Simultaneous Stimulated Raman Scattering and Optical Frequency Mixing in Lithiam Iodate"; Appl. Phys. Lett. 34(12), Jun. 15, 1979; pp. 838-840.

R. D. Dupuis; "An Introduction to the Development of the Semiconductor Laser"; IEEE J. Quantum Electron, vol. QE-23, No. 6, pp. 651-657 (1987).

J. E. Ripper et al., "Optical Coupling of Adjacent Strip-Geometry Junction Lasers"; Appl. Phys. Lett., 17, 371 (1970).

Dahmani et al.; "Frequency Stabilization of Semiconductor Lasers by Rosemont Optical Feedback"; Optics Letters; vol. 12, No. 11; Nov. 1987; pp. 876-878.

Tanner et al.; "Atomic Beam Collimation Using a Laser Diode with a Self-Locking Power-Buildup Cavity"; Optics Letters, vol. 13, No. 5, pp. 357-359 (May 1988).

*Primary Examiner*—William L. Sikes
*Assistant Examiner*—B. Holloway
*Attorney, Agent, or Firm*—Richard A. Kretchmer; William H. Magidson; Ralph C. Medhurst

[57] ABSTRACT

Optical radiation from a laser diode is frequency modified through interaction with a nonlinear optical material in an external optical cavity. High efficiency frequency modification is achieved through the use of optical feedback from the external cavity to narrow the linewidth of the laser diode output and frequency lock the laser diode to the external cavity.

21 Claims, 1 Drawing Sheet

OPTICAL FEEDBACK CONTROL IN THE FREQUENCY CONVERSION OF LASER DIODE RADIATION

CROSS-REFERENCE TO RELATED APPLICATIONS

This application is a continuation-in-part of application Ser. No. 125,161, filed Nov. 25, 1987, which is a continuation-in-part of application Ser. No. 78,373, filed July 27, 1987.

FIELD OF THE INVENTION

This invention relates to the conversion of coherent optical radiation from a laser diode into coherent optical radiation of a different frequency by interaction with a nonlinear optical material within an external optical cavity. More particularly, it relates to the use of optical feedback from the external cavity in such a process to narrow the linewidth of the laser diode output and frequency lock the laser diode to the external optical cavity.

BACKGROUND OF THE INVENTION

A laser is a device which has the ability to produce coherent light through the stimulated emission of photons from atoms, molecules or ions of an active medium which have typically been excited from a ground state to a higher energy level by an input of energy. Such a device contains an optical cavity or resonator which is defined by highly reflecting surfaces which form a closed round trip path for light, and the active medium is contained within the optical cavity.

If a population inversion is created by excitation of the active medium, the spontaneous emission of a photon from an excited atom, molecule or ion undergoing transition to a lower energy state can stimulate the emission of photons of substantially identical energy from other excited atoms, molecules or ions. As a consequence, the initial photon creates a cascade of photons between the reflecting surfaces of the optical cavity which are of substantially identical energy and exactly in phase. A portion of this cascade of photons is then discharged out of the optical cavity, for example, by transmission through one or more of the reflecting surfaces of the cavity. These discharged photons constitute the laser output.

Excitation of the active medium of a laser can be accomplished by a variety of methods. However, the most common methods are optical pumping, use of an electrical discharge, and the passage of an electric current through the p-n junction of a semiconductor laser.

Semiconductor lasers contain a p-n junction which forms a diode, and this junction functions as the active medium of the laser. Such devices are referred to as laser diodes and, as used herein, the term laser diode includes laser diode arrays.

By appropriate selection of the laser diode composition, it is possible to produce a device which emits output radiation at substantially any wavelength over the range from about 630 to about 1600 nm. For example, the wavelength of the output radiation from a InGaAsP based device can be varied from about 750 to about 900 nm by variation of the device composition. Similarly, the wavelength of the output radiation from an InGaAsP based device can be varied from about 1000 to about 1600 nm by variation of the device composition.

The conversion of optical radiation of one frequency to optical radiation of another frequency through interaction with a nonlinear optical material is well-known and has been extensively studied. Examples of such conversion include harmonic generation, optical mixing and parametric oscillation.

Materials having nonlinear optical properties are well-known. For example, U.S. Pat. No. 3,949,323 issued to Beirlen et al. on Apr. 6, 1976, discloses that nonlinear optical properties are possessed by materials having the formula $MTiO(XO_4)$ where M is at least one of K, Rb, Tl and $NH_4$; and X is at least one of P or As, except when $NH_4$ is present, then X is only P. This generic formula potassium titanyl phosphate, $KTiOPO_4$, a particularly useful nonlinear material. Other known nonlinear optical materials include, but are not limited to, $KH_2PO_4$, $LiNbO_3$, $KNbO_3$, $\beta$-$BaB_2O_4$, $Ba_2NaNb_5O_{15}$, $LiIO_3$, $HIO_3$, $KB_5O_8 \cdot 4H_2O$, potassium lithium niobate and urea. A review of the nonlinear optical properties of a number of different uniaxial crystals has been published in Sov. J. Quantum Electron., Vol. 7, No. 1, Jan. 1977, pp. 1–13. Nonlinear optical materials have also been reviewed by S. Singh in the CRC Handbook of Laser Science and Technology, Vol. III, M. J. Weber, Ed., CRC Press, Inc., Boca Raton, Fla., 1986, pp. 3–228.

Second-harmonic generation or "frequency doubling" is perhaps the most common and important example of nonlinear optics wherein part of the energy of an optical wave of angular frequency $\omega$ propagating through a nonlinear optical material is converted to energy of a wave of angular frequency $2\omega$. Second-harmonic generation has been reviewed by A. Yariv in Quantum Electronics, Second Ed., John Wiley & Sons, New York, 1975 at pages 407–434 and by W. Koechner in Solid State Laser Engineering, Springer Verlag, New York, 1976 at pages 491–524.

As used in this application, the term "optical mixing" refers to the interaction within a nonlinear optical material of two beams of light having frequencies $\omega_1$ and $\omega_2$ to produce optical radiation of a different frequency. For example, where $\omega_1$ is greater than $\omega_2$, this interaction can produce optical radiation at the sum-frequency, $\omega_3 = \omega_1 + \omega_2$, and at the difference-frequency, $\omega_4 = \omega_1 - \omega_2$. These two processes are referred to as sum-frequency generation and difference-frequency generation, respectively. Up-conversion refers to the special case of sum-frequency generation where radiation of one frequency, for example $\omega_1$, is much more intense than that at $\omega_2$ and, accordingly, does not undergo any appreciable change in amplitude as optical mixing occurs to give optical radiation of wavelength $\omega_3$. Optical mixing also includes higher order processes such as $\omega_5 = \omega_1 + 2\omega_2$ and $\omega_6 = 2\omega_1 - 2\omega_2$. For the purposes of this application, the optical radiation produced by optical mixing is generically referred to as "optical mixing radiation."

The frequency conversion of optical radiation by a nonlinear optical material can be carried out either within or outside of an optical cavity. If the process is carried out within an optical cavity, that cavity can be either: (a) a component of one of the sources of radiation for the process, or (b) separate from any cavity utilized as a component of any source of radiation for the process. For convenience, the use of such a source cavity will hereinafter be referred to as an intracavity process and the use of a separate cavity will be referred to as an external cavity process. For the purposes of this application, an optical cavity or resonator refers to a volume, which is bounded at least in part by highly reflecting surfaces, wherein light of certain discrete frequencies can set up standing wave modes of low loss.

The up-conversion of infrared radiation to the visible and ultraviolet range has been extensively studied. Such studies have been primarily motivated by an interest in using this technique to permit the detection and analysis of infrared radiation by the conventional and efficient methods that are available for light of higher frequency. Since the up-converted radiation carries essentially all of the information of the input infrared radiation, potential applications include infrared signal detection, infrared spectral analysis and infrared holography.

Up-conversion of infrared radiation has been reviewed by E. S. Voronin et al., *Sov. Phys. Usp.*, Vol. 22, No. 1, pp. 26–45 (Jan. 1979) and J. Warner, "Difference Frequency Generation and Up-Conversion" in *Quantum Electronics*, Vol. I, Nonlinear Optics, Part B, H. Rabin and C. L. Tang, Ed., Academic Press, New York, pp. 703–737 (1975). A theoretical discussion of infrared detection by sum-frequency generation has also been published by D. A. Kleinman et al., *J. Appl. Phys.*, Vol. 40, No. 2, pp. 546–566 (Feb. 1969).

At page 34 of their previously-cited review article, E. S. Veronin et al. describe the up-conversion of infrared radiation from a $CO_2$ laser within the cavity of a YAG:$Nd^{3+}$ laser using proustite as the nonlinear optical material. In addition, E. Liu et al., *Applied Optics*, Vol. 21, No. 19, pp. 3415–3416 (1 Oct. 1982) have reported the generation of radiation at wavelengths in the range from 252 nm to 268 nm by intracavity sum-frequency generation in a 90° phase-matched temperature-tuned ammonium dihydrogen phosphate crystal, of selected output lines from an argon ion laser and the traveling wave in a rhodamine 110 ring dye laser. Further, U.S. Pat. No. 3,646,358, issued to Firester on Feb. 29, 1972, discloses the up-conversion of signal radiation from an external source within the cavity of a laser wherein the polarization of the signal beam is orthogonal to that of the pump beam which is generated within the laser cavity.

At pages 559–564 of their above-cited review article, D. A. Kleinman et al. have discussed the theoretical aspects of sum-frequency generation in an external cavity. In addition, V. L. Aleinikov et al., *Sov. J. Quantum Electron.*, Vol. 13, No. 8, pp. 1059–1061 (Aug. 1983), have analyzed the theoretical aspects of parametric up-conversion in an external cavity. Further, H. Hemmati et al., *Optics Letters*, Vol. 8, No. 2, pp. 73–75 (Feb. 1983), have reported the generation of radiation at a wavelength of 194 nm by sum-frequency generation in an external cavity using as input radiation: (a) the 257 nm second harmonic of the output of a continuous wave (cw) 515 nm argon-ion laser, and (b) the output of a tunable cw dye laser in the 792 nm region.

Difference-frequency generation has been reviewed in the above-cited review article in *Quantum Electronics*, 5 Vol. I, at pp. 735–736 and by R. L. Aggarwal et al. in *Nonlinear Infrared Generation*, Y.-R. Shen, Ed., Springer verlag, Berlin, pp. 19–38 (1977).

Dahmani et al. have reported in *Optics Letters*, Vol. 12, No. 11, pp. 876–878 (Nov. 1987) that a separate Fabry-Perot cavity can be used to provide optical feedback to a single mode, 850 nm GaAlAs laser diode that forces the laser diode to lock its frequency to that of the cavity resonance. As a consequence, the frequency of the diode laser is stabilized and the linewidth of the laser is reduced by a factor of 1000 from 20 MHz to approximately 20 kHz.

There is a current need for efficient, compact and reliable lasers which operate in the infrared, visible and ultraviolet portion of the spectrum and are capable of modulation rates over the range from 0 Hz to in excess of 1 GHz over a wide range of intensities. Such devices would be useful for applications which include optical storage of data, reprographics, spectroscopy and communications. For example, the storage of data on optical disks requires a source of coherent radiation which can be modulated at a rate between about 5 and about 20 MHz, and such radiation is desirably in the visible or ultraviolet portion of the spectrum in order to maximize data storage within a given area. In addition, compact coherent sources of red, green and blue light would be highly attractive for television applications requiring a high brightness source. The use of three such lasers in place of the red, green and blue electron guns of a conventional television picture tube would result in a high brightness television projector that would be useful in simulation systems and large screen television systems. Laser diodes possess all of the above-described capabilities except for one—their output is in a limited part of the electromagnetic spectrum at wavelengths in the range from about 630 nm to about 1600 nm.

SUMMARY OF THE INVENTION

The present invention is directed to an efficient, compact and reliable laser which can be operated in the infrared, visible and ultraviolet portion of the spectrum and is capable of modulation rates over the range from 0 Hz to in excess of 1 GHz.

We have discovered that coherent optical radiation (coherent radiation in the infrared, visible and ultraviolet regions of the spectrum) can be produced by conversion of radiation from a laser diode into radiation of another frequency through interaction with a nonlinear optical material in an external cavity. We have also discovered that the efficiency of this conversion can be substantially increased through the use of optical feedback from the external cavity to the laser diode. Because the frequency of the output radiation from such conversion is a function of the input frequency or frequencies, the wavelength of the output radiation can be conveniently varied over much of the optical spectrum and all of its visible portion merely by appropriate selection of the laser diode or laser diodes used. In addition, the resulting device substantially retains the reliability and compact size of its solid state components.

One embodiment of the invention is an apparatus for generating coherent optical radiation which comprises: (a) laser diode means for generating coherent optical radiation of a first frequency; (b) an optical cavity which is resonant for optical radiation of said first frequency and separate from any optical cavity used as a component of said laser diode means; (c) means for introducing said radiation of a first frequency from the laser diode means into said optical cavity; (d) feedback means for returning a minor portion of said radiation of a first frequency from said optical cavity to the laser diode means, wherein said minor portion is effective to narrow the linewidth of the optical output from said laser diode means and to lock the optical output from the laser diode means at said first frequency; and (e) nonlinear optical means disposed within said optical cavity for interacting with said radiation of a first frequency to generate coherent radiation of a second frequency.

Another embodiment of the invention is an apparatus for generating coherent optical radiation which comprises: (a) means for generating coherent radiation of a first frequency, $\omega_1$; (b) laser diode means for generating coherent optical radiation of a second frequency, $\omega_2$; (c) an optical cavity which is resonant for optical radiation of said second frequency and separate from any utilized as a component of said input means and laser diode means; (d) means for introducing said radiation of a first frequency and said radiation of a second frequency into said optical cavity; (e) feedback means for returning a minor portion of said radiation of a second frequency from said optical cavity to the laser diode means, wherein said minor portion is effective to narrow the linewidth of the optical output from said laser diode means and to lock the optical output from the laser diode means at said second frequency; and (f) nonlinear optical means disposed within said optical cavity for interacting with said radiation of a first frequency and said radiation of a second frequency to generate coherent radiation of a third frequency, $\omega_3$.

Another embodiment of the invention is a method for generating coherent optical radiation which comprises: (a) generating coherent optical radiation of a first frequency from a laser diode; (b) introducing said radiation of a first frequency into an optical cavity which is resonant for said radiation of a first frequency and separate from any optical cavity utilized as a component of said laser diode; (c) generating an optical feedback signal for said laser diode by withdrawing a minor amount of said radiation of a first frequency from the optical cavity and returning said minor amount of radiation to the laser diode to narrow the linewidth of the optical output from the laser diode and to lock the optical output from the laser diode at said first frequency; and (d) interacting said radiation of a first frequency with a nonlinear optical material disposed within said optical cavity to generate coherent radiation of a second frequency.

A further embodiment of the invention is a method for generating coherent optical radiation which comprises: (a) generating coherent optical radiation of a first frequency, $\omega_1$, from a first source; (b) generating coherent optical radiation of a second frequency, $\omega_2$, from a second source which consists of a laser diode; (c) introducing said radiation of a first and second frequency into an optical cavity which is resonant for said radiation of a second frequency and separate from any utilized as a component of said first and second sources; (d) generating an optical feedback signal for said laser diode by withdrawing a minor amount of said radiation of a second frequency from the optical cavity and returning said minor amount of radiation to the laser diode to narrow the linewidth of the optical output from the laser diode and to lock the optical output from the laser diode at said second frequency; and (e) interacting said radiation of a first frequency and said radiation of a second frequency with a nonlinear optical material disposed within said optical cavity to generate coherent optical radiation of a third frequency, $\omega_3$.

An object of the invention is to provide a solid state device for the generation of coherent radiation in the infrared, visible and ultraviolet portion of the spectrum.

Another object of the invention is to provide a compact source of coherent light in the infrared, visible and ultraviolet portion of the spectrum which is efficient and reliable.

Another object of the invention is to provide an easily modulated source of coherent radiation in the infrared, visible and ultraviolet portion of the spectrum.

Another object of the invention is to provide a device for the generation of coherent optical radiation by frequency modification of the output from a laser diode.

A still further object of the invention is to provide an efficient method for the frequency modification of optical radiation from a laser diode.

DETAILED DESCRIPTION OF THE PREFERRED EMBODIMENTS

While this invention is susceptible of embodiment in many forms, there are schematically shown in FIGS. 1-4, four specific embodiments, with the understanding that the present disclosure is not intended to limit the invention to the embodiments illustrated.

Figure 1:
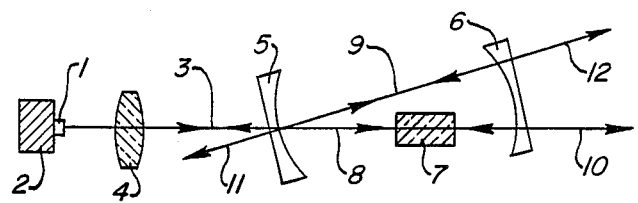
FIG. 1 of the drawings is a schematic representation of an embodiment of the invention which involves harmonic generation from the output of a laser diode in a confocal optical cavity.

With reference to FIG. 1, laser diode 1 is mounted on heat sink 2. Coherent radiation from laser diode 1 is focused along beam path 3 by focusing means 4 and injected into the external confocal Fabry-Perot optical cavity which is defined by mirrors 5 and 6 and contains nonlinear optical material 7. A resonant field (cavity radiation) is generated within the external optical cavity along paths 8 and 9 as a consequence of the injection of radiation from laser diode 1. Interaction of cavity radiation with nonlinear optical material 7 results in the generation of a harmonic of the cavity radiation which is discharged through mirror 6 as output radiation along paths 10 and 12. A minor amount of the cavity radiation is transmitted through mirror 5 and returned as optical feedback to laser diode 1 along beam path 3 to narrow the linewidth of the laser diode output and lock the laser diode frequency to that of the external confocal optical cavity. Any radiation from laser diode 1 which is back reflected by mirror 5 is rejected along path 11.

Laser diode 1 is a single stripe laser diode. Such a device is conventionally attached to a heat sink 2 which serves to dissipate any waste heat generated by the laser diode 1. Although heat sink 2 can be passive in character, it can also comprise a thermoelectric cooler or other temperature regulation means to help maintain laser diode 1 at constant temperature and thereby ensure optimal operation of laser diode 1 at the desired wavelength. It will be appreciated, of course, that during operation, laser diode 1 will be attached to a suitable power supply. Electrical leads from laser diode 1, which are directed to a power supply, are not illustrated in FIG. 1.

Conventional laser diodes are available which, as a function of composition, can produce output radiation having a wavelength over the range from about 630 to about 1600 nm, and any such device can be used in the practice of this invention as laser diode 1. For example, by appropriate adjustment of composition, GaAlAs based devices can be used to provide radiation in the wavelength range from about 750 to about 900 nm, and InGaAsP devices can be used to provide radiation in the wavelength range from about 1000 to about 1600 nm.

Focusing means 4 serves to focus input radiation from laser diode 1 into the confocal optical cavity defined by mirrors 5 and 6. This focusing is preferably such that the formation of harmonic output radiation is optimized. Any conventional optical means for focusing light can be used as focusing means 4. For example, a gradient index lens, a ball lens, an aspheric lens or a combination of lenses can be utilized. It will be appreciated, however, that focusing means 4 is not essential to the practice of this invention and the use of such focusing means merely represents a preferred embodiment.

Input radiation from laser diode 1 passes along beam path 3 and into the confocal Fabry-Perot optical cavity defined by mirrors 5 and 6. In such a cavity, the mirror separation or cavity length is equal to the radius of curvature of the mirrors. In addition, beam path 3 is off the optical axis of the optical cavity. Accordingly, the cavity functions as a device from which cavity radiation can be discharged along four different paths, 3, 10, 11 and 12. As a consequence of the properties of a Fabry-Perot cavity, the beam of radiation along path 11 is a combination of any back reflected input radiation from laser diode 1 together with any cavity radiation transmitted through mirror 5 along beam path 9. The beam along path 11 will have a power minimum when the frequency of laser diode 1 matches a cavity resonance. Cavity radiation discharged along paths 3, 10 and 12 will have a power maximum when the input radiation from laser diode 1 is resonant with the cavity. Cavity radiation discharged along path 3 functions as an optical feedback to laser diode 1 and has two major effects—it results in a substantial narrowing of the linewidth of the optical output from the laser diode and it also acts to lock the frequency of the laser diode output radiation to a resonance of the external cavity. If desired, conventional means can be placed in beam path 3 in order to adjust and control the amount of optical feedback to laser diode 1. For example, a variable Faraday isolator is highly satisfactory for this purpose.

A minor amount of the cavity radiation is returned to laser diode 1 as optical feedback. The precise amount of feedback required will be a function of the laser diode used. For example, the type of facet coating, if any, on the laser diode will have an effect on the amount of optical feedback required. Typically, however, less than about 5% of the cavity radiation will be required as feedback in the practice of this invention.

If necessary, the phase of the optical feedback to laser diode 1 can be adjusted by conventional means to maximize the resonant field within the external cavity. For example, phase adjustment of the optical feedback can be accomplished by changing the spacing between the external optical cavity and diode laser 1 with a piezoelectric element, by changing the temperature of the structure separating these two components, or by incorporating an electro-optic element having a field-dependent optical path between the external optical cavity and diode laser 1.

The optical feedback from the external cavity to the laser diode is important because it makes it easier to match the laser diode frequency with that of the external cavity. This is a consequence of the fact that the feedback forces the laser diode to run at a frequency which satisfies the Fabry-Perot resonance condition for the external cavity. In addition, the optical feedback to the laser diode reduces the linewidth of the diode output and, accordingly, results in an improved frequency conversion of the diode output in the external cavity. This control over frequency and linewidth of the diode output permits the generation of an intense intracavity resonant field within a high finesse external cavity. It will be appreciated, of course, that the efficiency of frequency conversion by nonlinear optical material 7 is a function of the intensity of the intracavity resonant field.

The precise type of external optical cavity utilized in the practice of this invention is not critical, and any conventional type of cavity can be substituted for the confocal cavity illustrated in FIG. 1. The use of the confocal cavity of FIG. 1 represents a preferred embodiment of the invention since such a cavity provides a simple method for generation of the required optical feedback for laser diode 1. It will also be appreciated that any convenient method can be used to generate the required optical feedback for the laser diode.

Cavity radiation circulating within the optical cavity defined by mirrors 5 and 6 interacts with nonlinear optical material 7. This interaction results in the conversion of cavity radiation to one of its harmonics, for example the second harmonic, which is discharged through mirror 6 as output radiation. By means of proper orientation of the nonlinear optical material with respect to the interacting cavity radiation (phase-matching) efficient harmonic generation of the desired type occurs. The procedures and criteria for the selection and phase-matching of nonlinear optical materials for a given frequency conversion process are conventional.

The geometric shape of nonlinear optical material 7 can vary widely. For example, it can be rod-shaped or rhombohedral in shape and can have lens-shaped surfaces if desired. It will also be appreciated that any such nonlinear optical component can comprise heating or cooling means to control the temperature of said nonlinear optical material and thereby optimize the phase-matching. Noncritical phase-matching is usually preferred when possible due to elimination of walk-off.

Potassium titanyl phosphate, $KTiOPO_4$, as well as $LiNbO_3$ and $KNbO_3$ are highly preferred nonlinear optical materials. However, it will be appreciated that any nonlinear optical material can be utilized in the practice of this invention. Suitable nonlinear optical materials include, but are not limited to, $KH_2PO_4$, $LiNbO_3$, $KNbO_3$, $\beta$-$BaB_2O_4$, $Ba_2NaNb_5O_{15}$, $LiIO_3$, $HIO_3$, $KB_5O_8 \cdot 4H_2O$, potassium lithium niobate, urea and compounds of the formula $MTiO(XO_4)$ where M is selected from the group consisting of K, Rb and Tl, and X is selected from the group consisting of P and As.

Modulation of the harmonic output radiation 10 can be easily accomplished by modulating input radiation from laser diode 1, for example, by modulation of the power supply to laser diode 1. Conventional means are available for modulating the output from laser diodes over the range from 0 Hz to in excess of 1 GHz, and the use of such modulation means represents a preferred embodiment of the invention.

In a specific example of the embodiment illustrated by FIG. 1, a 10 mW single stripe Mitsubishi ML 2701 laser diode having a room temperature emission wavelength of 886 nm is used as laser diode 1. Collimated light from the laser diode is passed through a Faraday isolator (not shown in FIG. 1) and is focused on the input mirror 5 of the confocal external cavity defined by mirrors 5 and 6. Mirrors 5 and 6 have a 2.5 cm radius of curvature and a reflectivity of 98.5% for radiation having a wavelength of 886 nm. Optical feedback from the external cavity is returned to the laser diode through the Faraday isolator which is used to adjust and control the amount of feedback. Nonlinear optical material 7 is a parallelepiped of potassium niobate ($KNbO_3$) which is antireflection-coated for radiation having a wavelength of 886 nm. The potassium niobate crystal is inserted in the external confocal cavity so that its crystallographic C-axis is substantially matched with the polarization of the incident radiation from laser diode 1, and the potassium niobate crystal is phase-matched for second harmonic generation by heating with a resistance heater (not shown in FIG. 1) to a temperature of about 77° C. Blue light having a wavelength of 443 nm is generated through interaction of the resonant field within the external cavity with the potassium niobate crystal and is discharged as output radiation along paths 10 and 12.

Figure 2:
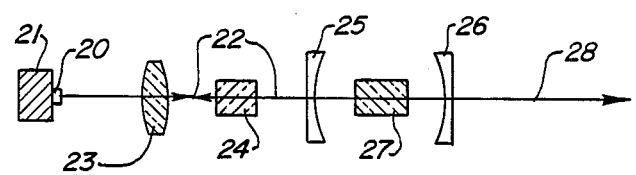
FIG. 2 of the drawings is a schematic representation of an embodiment of the invention which involves harmonic generation from the output of a laser diode in a linear standing wave optical cavity.

FIG. 2 schematically illustrates a second embodiment of the invention wherein harmonic generation is carried out in a linear standing wave Fabry-Perot optical cavity and a Faraday isolator which has its output polarizer removed is used to isolate the laser diode from back reflected light. With reference to FIG. 2, laser diode 20 is mounted on heat sink 21. Coherent radiation from laser diode 20 is focused along beam path 22 by focusing means 23, passed through Faraday isolator 24 which has its output polarizer removed, and injected into the linear standing wave Fabry-Perot optical cavity which is defined by mirrors 25 and 26 and contains nonlinear optical material 27. The resonant field (cavity radiation) within the external optical cavity interacts with nonlinear optical material 27, and this interaction results in the formation of a harmonic of the cavity radiation which is discharged through mirror 26 as output radiation 28. A minor amount of the cavity radiation is transmitted through mirror 25 and returned as feedback to laser diode 20 along beam path 22 to narrow the linewidth of the laser diode and lock the laser diode frequency to that of the external optical cavity. Any radiation from laser diode 20 which is back reflected along path 22 by mirror 25 is blocked by Faraday isolator 24 and prevented from returning to laser diode 20.

Any radiation from laser diode 20 which is back reflected to the laser diode from mirror 25 will have an undesirable tendency to produce amplitude and frequency fluctuations in the output radiation from laser diode 20. Accordingly, laser diode 20 is isolated from any such back reflected radiation by Faraday isolator 24. Light from laser diode 20 is linearly polarized. Accordingly, back reflected light from mirror 25 is polarized in the same manner and is prevented from returning to the laser diode by Faraday isolator 24. However, any portion of the cavity radiation transmitted through mirror 25 which is rotated into an orthogonal polarization by the birefringence of nonlinear optical material 27 or of other cavity components will pass through Faraday isolator 24, since its output polarizer is removed, and return to laser diode 20 as an optical feedback signal. The amount of optical feedback to laser diode 20 can be adjusted by conventional means, for example, by adjusting the reflectivity of mirror 25.

Figure 3:
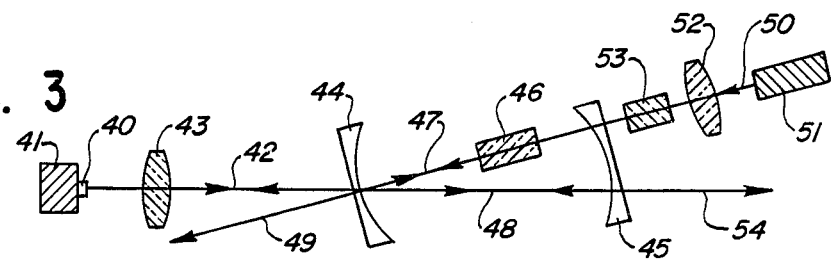
FIG. 3 of the drawings is a schematic representation of an embodiment of the invention which involves optical mixing of the output from a laser diode in a confocal optical cavity.

FIG. 3 schematically illustrates a third embodiment of the invention wherein optical mixing radiation is generated within an external confocal Fabry-Perot optical cavity. With reference to FIG. 3, laser diode 40 is mounted on heat sink 41. Coherent radiation of a first frequency $\omega_1$ from laser diode 40 is focused along beam path 42 by focusing means 43 and injected into the external confocal Fabry-Perot optical cavity which is defined by mirrors 44 and 45 and contains nonlinear optical material 46. The resonant field (cavity radiation) generated within the external optical cavity by injection of radiation from laser diode 40 is established along paths 47 and 48. A minor amount of the cavity radiation is transmitted through mirror 44 and returned as feedback to laser diode 40 along beam path 42 to narrow the linewidth of the laser diode output and lock the laser diode frequency to that of the external confocal optical cavity. Any radiation from laser diode 40 which is back reflected by mirror 44 is rejected along path 49. Coherent input radiation 50 of a second frequency $\omega_2$ from radiation source 51 is focused by focusing means 52, passed through optical isolator 53 and injected into the external optical cavity along path 47. Radiation from laser diode 40 and input radiation from radiation source 51 undergo optical mixing in nonlinear optical material 46 which is phase-matched for the desired optical mixing process, for example, sum-frequency generation. At least a portion of the resulting optical mixing radiation of frequency $\omega_3$ is passed through mirror 45 as output radiation 54.

Radiation source 51 can be any source of coherent optical radiation. Suitable sources include, but are not limited to, dye lasers and solid state lasers. However, a laser diode is a highly preferred source.

The external optical cavity which is defined by mirrors 44 and 45 is resonant for radiation from laser diode 40. If desired, the cavity can also be resonant for: (a) either input radiation from source 51 or output radiation 54; or (b) both input radiation from source 51 and output radiation 54. Indeed, if source 51 is a laser diode, optical feedback from the external cavity can be used to narrow its linewidth and lock its frequency to that of the external cavity in the same manner as for laser diode 40.

Optical isolator 53 serves to prevent any reflection of input radiation 50 from mirror 45 and back to source 51. Any such backreflection will have an undesirable tendency to produce amplitude and frequency fluctuations in the output radiation from source 51. Any conventional means for effecting optical isolation of source 51 can be used, for example, a Faraday isolator or a quarter wave plate. However, it will be appreciated that optical isolation of input source 51 is not essential to the practice of this invention and merely represents a preferred embodiment.

Output radiation 54 can be the product of any desired optical mixing process, and nonlinear optical material 46 will be phase-matched for the selected optical mixing process. For example, where $\omega_1$ is greater than $\omega_2$, the optical mixing process can be either sum-frequency generation ($\omega_3 = \omega_1 + \omega_2$) or difference frequency generation ($\omega_3 = \omega_1 - \omega_2$).

In a preferred embodiment, input radiation from laser diode 40 and input radiation 50 from radiation source 51 are both polarized and the polarizations adjusted in such a manner that the efficiency of optical mixing in nonlinear optical material 46 is optimized. For example, with sum-frequency generation, these polarizations should be orthogonal for Type II phase-matching and identical for Type I phase-matching.

Modulation of the optical mixing output radiation 54 can be easily accomplished by modulating either input radiation from laser diode 40 or input radiation from radiation source 51. When a laser diode is used to provide input radiation, such modulation can be conveniently effected by modulation of the power supply to the laser diode.

Figure 4:
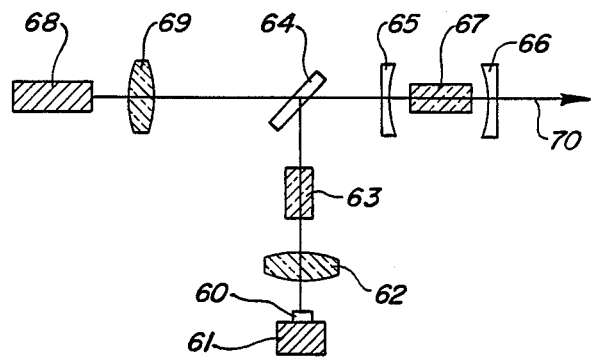
FIG. 4 of the drawings is a schematic representation of an embodiment of the invention which involves optical mixing of the output from a laser diode in a linear standing wave optical cavity.

FIG. 4 schematically illustrates a fourth embodiment of the invention wherein optical mixing radiation is generated within a linear standing wave Fabry-Perot optical cavity rather than the confocal cavity illustrated in FIG. 3. With reference to FIG. 4, laser diode 60 is mounted on heat sink 61. Coherent radiation of a first frequency $\omega_1$ from laser diode 60 is focused by focusing means 62, passed through Faraday isolator 63 which has its output polarizer removed, reflected off 90-degree bending mirror 64, and injected into the external linear standing wave Fabry-Perot optical cavity which is defined by mirrors 65 and 66 and contains nonlinear optical material 67. A minor amount of the resonant field (cavity radiation) generated within the external optical cavity by injection of radiation from laser diode 60 is transmitted through mirror 65 and is returned as feedback to laser diode 60 along the path of input radiation for the cavity from the diode to narrow the linewidth of the diode output and lock the diode frequency to that of the external cavity. Any radiation from laser diode 60 which is backreflected along the input path by mirror 65 is blocked by Faraday isolator 3 and prevented from returning to diode laser 60. Coherent input radiation of a second frequency $\omega_2$ from radiation source 68 is focused by focusing means 69, passed through 90-degree mirror 64, and injected into the external cavity defined by mirrors 65 and 66. Radiation from laser diode 60 and radiation source 68 undergo optical mixing in nonlinear optical material 67 which is phase-matched for the desired optical mixing process. At least a portion of the resulting optical mixing radiation of frequency $\omega_3$ is passed through mirror 66 as output radiation 70.

Ninety-degree bending mirror 64 is constructed in such a way that it is highly reflective for input radiation from laser diode 60 but substantially transparent to input radiation from source 68. For example, mirror 64 can comprise a suitable dielectric coating on a suitable substrate. It will be appreciated, however, that 90-degree bending mirror 64 is not an essential element of the invention. In the absence of bending mirror 64, any convenient alternative method can be utilized to inject input radiation from laser diode 60 and source 68 into the external cavity defined by mirrors 65 and 66.

We claim:

1. An apparatus for generating coherent optical radiation which comprises:
   (a) laser diode means for generating coherent optical radiation of a first frequency;
   (b) an optical cavity which is resonant for optical radiation of said first frequency and separate from any optical cavity used as a component of said laser diode means;
   (c) means for introducing said radiation of a first frequency from the laser diode means into said optical cavity;
   (d) feedback means for returning a minor portion of said radiation of a first frequency from said optical cavity to the laser diode means, wherein said minor portion is effective to narrow the linewidth of the optical output from said laser diode means and to lock the optical output from said laser diode means at said first frequency; and
   (e) nonlinear optical means disposed within said optical cavity for interacting with said radiation of a first frequency to generate coherent radiation of a second frequency.

2. The apparatus of claim 1 wherein said radiation of a second frequency is the second harmonic of said radiation of a first frequency.

3. The apparatus of claim 1 which additionally comprises means for effecting the modulation of said radiation of a first frequency.

4. The apparatus of claim 1 wherein said nonlinear optical means is comprised of a material selected from the group consisting of $KTiOPO_4$, $LiNbO_3$ and $KNbO_3$.

5. An apparatus for generating coherent optical radiation which comprises:
   (a) input means for generating coherent radiation of a first frequency, $\omega_1$;
   (b) laser diode means for generating coherent optical radiation of a second frequency, $\omega_2$;
   (c) an optical cavity which is resonant for optical radiation of said second frequency and separate from any utilized as a component of said input means and laser diode means;
   (d) means for introducing said radiation of a first frequency and said radiation of a second frequency into said optical cavity;
   (e) feedback means for returning a minor portion of said radiation of a second frequency from said optical cavity to the laser diode means, wherein said minor portion is effective to narrow the linewidth of the optical output from said laser diode means and to lock the optical output from the laser diode means at said second frequency; and
   (f) nonlinear optical means disposed within said optical cavity for interacting with said radiation of a first frequency and said radiation of a second frequency to generate coherent radiation of a third frequency, $\omega_3$.

6. The apparatus of claim 5 wherein $\omega_3 = \omega_1 + \omega_2$.

7. The apparatus of claim 5 wherein $\omega_3$ is the difference between $\omega_1$ and $\omega_2$.

8. The apparatus of claim 5 wherein said input means comprises a laser diode.

9. The apparatus of claim 5 which additionally comprises means for effecting the modulation of said radiation of a second frequency.

10. The apparatus of claim 5 which additionally comprises means for adjusting and controlling the polarization of said radiation of a first frequency and the polarization of said radiation of a second frequency.

11. The apparatus of claim 5 wherein said nonlinear optical means is comprised of a material selected from the group consisting of $KTiOPO_4$, $LiNbO_3$ and $KNbO_3$.

12. A method for generating coherent optical radiation which comprises:
   (a) generating coherent optical radiation of a first frequency from a laser diode;
   (b) introducing said radiation of a first frequency into an optical cavity which is resonant for said radiation of a first frequency and separate from any optical cavity utilized as a component of said laser diode;

(c) generating an optical feedback signal for said laser diode by withdrawing a minor amount of said radiation of a first frequency from the optical cavity and returning said minor amount of radiation to the laser diode to narrow the linewidth of the optical output from the laser diode and to lock the optical output from the laser diode at said first frequency; and (d) interacting said radiation of a first frequency with a nonlinear optical material disposed within said optical cavity to generate coherent radiation of a second frequency.

13. The method of claim 12 wherein said second frequency is the second harmonic of said first frequency.

14. The method of claim 12 which additionally comprises effecting the modulation of said radiation of a second frequency by modulating said radiation of a first frequency.

15. The method of claim 12 wherein said nonlinear optical material is selected from the group consisting of $KTiOPO_4$, $LiNbO_3$ and $KNbO_3$.

16. A method for generating coherent optical radiation which comprises:

(a) generating coherent optical radiation of a first frequency, $\omega_1$, from a first source;

(b) generating coherent optical radiation of a second frequency $\omega_2$, from a second source which consists of a laser diode;

(c) introducing said radiation of a first and second frequency into an optical cavity which is resonant for said radiation of a second frequency and separate from any utilized as a component of said first and second sources;

(d) generating an optical feedback signal for said laser diode by withdrawing a minor amount of said radiation of a second frequency from the optical cavity and returning said minor amount of radiation to the laser diode to narrow the linewidth of the optical output from the laser diode and to lock the optical output from the laser diode at said second frequency; and (e) interacting said radiation of a first frequency and said radiation of a second frequency with a nonlinear optical material disposed within said optical cavity to generate coherent optical radiation of a third frequency, $\omega_3$.

17. The method of claim 16 wherein $\omega_3 = \omega_1 + \omega_2$.

18. The method of claim 16 wherein $\omega_3$ is the difference between $\omega_1$ and $\omega_2$.

19. The method of claim 16 wherein said first source comprises a laser diode.

20. The method of claim 16 which additionally comprises effecting the modulation of said radiation of a third frequency by modulating said radiation of a second frequency.

21. The method of claim 16 wherein said nonlinear optical material is selected from the group consisting of $KTiOPO_4$, $LiNbO_3$ and $KNbO_3$.

* * * * *

UNITED STATES PATENT OFFICE
CERTIFICATE OF CORRECTION

Patent No. 4,884,276                    Dated  November 28, 1989

Inventor(s) George J. Dixon, Douglas W. Anthon and John H. Clark

It is certified that error appears in the above-identified patent and that said Letters Patent is hereby corrected as shown below:

Column 1, lines 64 & 65, "InGaASP" should read --GaAlAs--.

Column 2, line 16, "formula potassium" should read --formula includes potassium--.

Column 2, line 20, "$KB_5O_8 . 4H_2O$" should read --$KB_5O_8 \cdot 4H_2O$--.

Column 2, line 38, "Springer Verlag" should read --Springer-Verlag--.

Column 3, line 61, "5 Vol. I" should read --Vol. I--.

Column 3, line 63, "Springer verlag" should read --Springer-Verlag--.

Column 7, lines 33 & 34, "FabryPerot" should read --Fabry-Perot--.

Column 11, line 35, "isolator 3" should read --isolator 63--.

Signed and Sealed this

Thirteenth Day of August, 1991

Attest:

HARRY F. MANBECK, JR.

Attesting Officer    Commissioner of Patents and Trademarks